(12) United States Patent
Chang et al.

(10) Patent No.: US 12,313,924 B2
(45) Date of Patent: May 27, 2025

(54) SELF-POWERED DISPLAY DEVICE

(71) Applicant: IRIS OPTRONICS CO., LTD., Tainan (TW)

(72) Inventors: Chung-Yi Chang, Tainan (TW); Chih-Wei Chen, Tainan (TW); Chi-Chang Liao, Tainan (TW)

(73) Assignee: IRIS OPTRONICS CO., LTD., Tainan (TW)

( * ) Notice: Subject to any disclaimer, the term of this patent is extended or adjusted under 35 U.S.C. 154(b) by 0 days.

(21) Appl. No.: 18/496,838

(22) Filed: Oct. 27, 2023

(65) Prior Publication Data

US 2025/0060624 A1 Feb. 20, 2025

(30) Foreign Application Priority Data

Aug. 16, 2023 (TW) ................................ 112130801

(51) Int. Cl.
*G02F 1/133* (2006.01)
*G02F 1/1335* (2006.01)
*H02S 40/20* (2014.01)

(52) U.S. Cl.
CPC .... *G02F 1/13324* (2021.01); *G02F 1/133512* (2013.01); *H02S 40/20* (2014.12)

(58) Field of Classification Search
None
See application file for complete search history.

(56) References Cited

U.S. PATENT DOCUMENTS

| | | | | |
|---|---|---|---|---|
| 7,136,138 B1 * | 11/2006 | Sekiguchi | ............. | G04C 10/04 368/242 |
| 2003/0081158 A1 * | 5/2003 | Li | ....................... | G02F 1/13306 349/113 |
| 2012/0105780 A1 * | 5/2012 | Jhan | .................... | G02F 1/13718 349/116 |
| 2013/0050599 A1 * | 2/2013 | Yoshida | ................ | H01L 31/075 349/33 |
| 2014/0179050 A1 * | 6/2014 | Bunea | ..................... | B32B 37/14 438/64 |
| 2015/0017758 A1 * | 1/2015 | Reginevich | ..... | H01L 31/022425 118/726 |
| 2016/0049904 A1 * | 2/2016 | Sasaki | ................... | H01L 31/048 136/251 |
| 2019/0022981 A1 * | 1/2019 | Labrot | .................... | G09F 3/203 |

FOREIGN PATENT DOCUMENTS

JP 2016142827 A * 8/2016

* cited by examiner

*Primary Examiner* — Shan Liu
(74) *Attorney, Agent, or Firm* — Cheng-Ju Chiang (57) ABSTRACT

A self-powered display device includes a display module and a power module. The display module is a cholesteric liquid crystal display module, and the power module is a solar cell module. The display module allows light to enter the power module from the front side, and the power module generates electricity upon receiving the light to provide the necessary energy for the display module to show images. The power module has multiple active areas and multiple inactive areas between the active areas. When the width of the inactive area is less than or equal to 50 μm, the human eye will have difficulty discerning the width of the inactive area. Additionally, a shielding layer can be placed on the inactive area to ensure that the visual color difference (ΔE) between the inactive area and the active area does not exceed 10 color difference units, thereby improving the image quality.

3 Claims, 7 Drawing Sheets

SELF-POWERED DISPLAY DEVICE

BACKGROUND OF THE INVENTION

1. Field of the Invention

The present invention relates to a self-powered display device, and in particular to a self-powered display device that improves color difference of the image or forms a confined visual area through a shielding layer.

2. Description of Related Art

Figure 1:
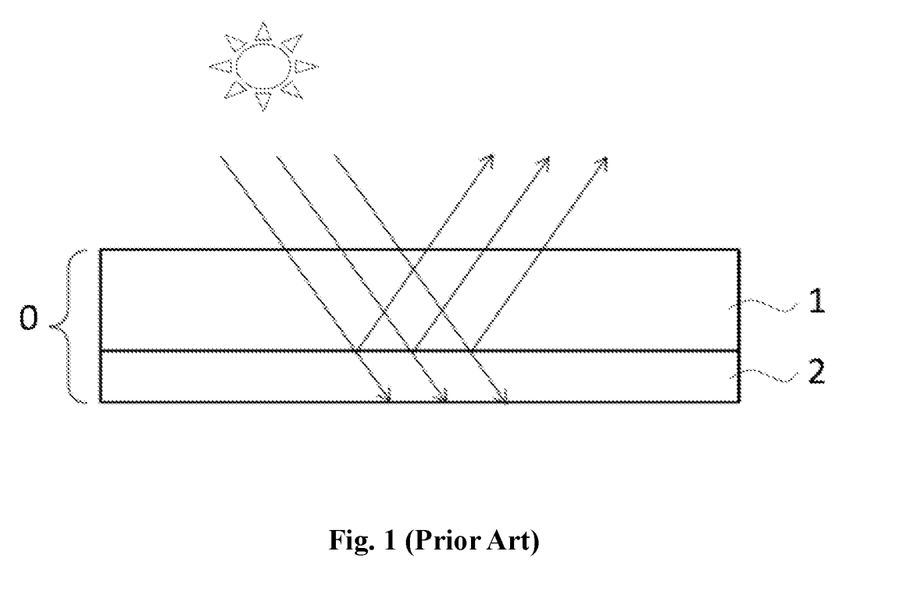
FIG. 1 is a diagram of a self-powered display in the prior art.

A self-powered display typically consists of a cholesteric liquid crystal display and a solar cell. The material used for the solar cell can be categorized into two types: opaque and light-transmitting, as illustrated in FIG. 1 in the prior art. A display, denoted as display 0, is using solar cells composed of the opaque material and comprises a cholesteric liquid crystal layer and a solar cell layer. Examples of the solar cell layer 2 may be single-crystalline silicon solar cell or polycrystalline silicon solar cell. When the solar cell layer 2 is opaque, high-efficiency power generation can be performed at a lower cost. When ambient light enters the display 0 from the environment, a portion of the light beams will be reflected by the cholesteric liquid crystal layer 1, as perceived by the human eye. The remaining portion of the light beams will pass through the cholesteric liquid crystal layer 1 and ultimately be absorbed by the solar cell layer 2. As a result, the solar cell layer 2 typically consists of two types of structures: busbars and fingers. These two structures are commonly made of metal materials such as materials like silver and other similar metals. However, this structure can significantly degrade the image quality of the display 0. That is to say, when displaying a black image, the cholesteric liquid crystal layer 1 is driven into the focal conic state, i.e. the transparent state, wherein the black image is essentially provided by the solar cell layer 2. In the region of the busbars and fingers, in addition to being unable to provide a black image, the stray light beams reflected by the metal material will also affect the display image. Besides, significant color discrepancies also arise between the region encompassing the busbars and fingers and the adjacent region lacking these elements. Consequently, the overall image quality of the display 0 is substantially diminished.

Figure 2:
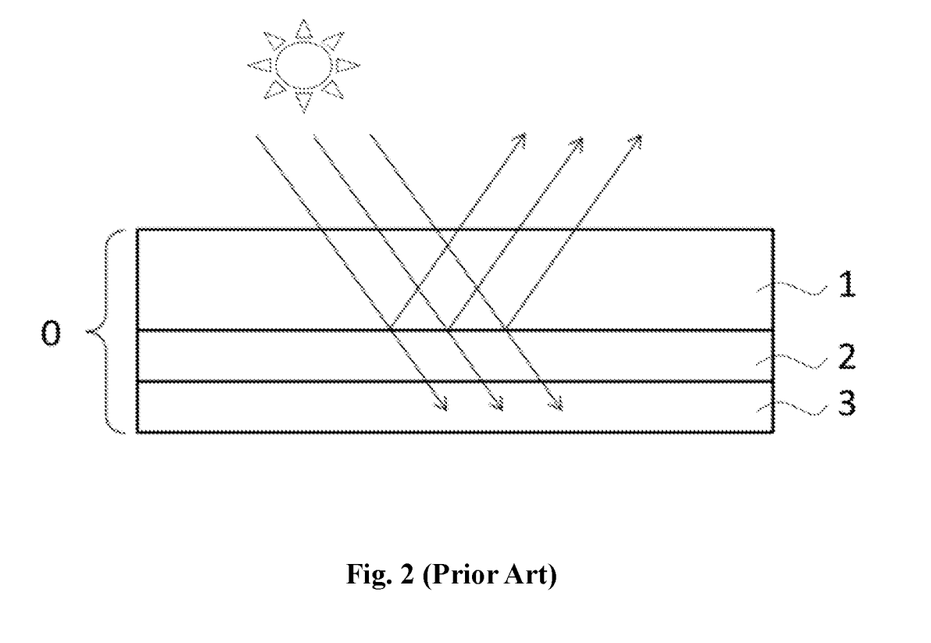
FIG. 2 is another diagram of a self-powered display in the prior art.

Furthermore, as shown in FIG. 2, it illustrates the display 0 with light-transmitting solar cells in the prior art, including a cholesteric liquid crystal layer 1, a solar cell layer 2, and a light-absorbing layer 3. The solar cell layer 2 can be, for example, an organic solar cell, dye-sensitized solar cell or perovskite solar cell, etc. When the solar cell layer 2 is in a transparent state, the ambient light enters the display 0 from the environment. A portion of the light beams will be reflected by the cholesteric liquid crystal layer 1 and be visible to the human eye, and another portion of the incident light beams traverses the cholesteric liquid crystal layer 1 and is absorbed by the solar cell layer 2. Stray light beams that penetrate the solar cell layer 2 are subsequently absorbed by the light-absorbing layer 3, wherein the light-absorbing layer 3 is usually made of black material.

To illustrate further, when the solar cell layer 2 is in a transparent state, and a black image is displayed, in this specific situation, the cholesteric liquid crystal layer 1 undergoes a transition to the focal conic state, leading to the manifestation of the black image. The black image is in fact provided by the solar cell layer 2 to which a light-absorbing layer 3 is attached so that the black image present in the area of the busbars and fingers of the transparent conductive material is presented by the light-absorbing layer 3, while the black image in other areas is provided by the solar cell layer 2. The human eye can easily perceive the color differences in the above two areas, i.e. the busbars and fingers constituted from transparent conductive materials, tend to be prominently noticeable when a black image is displayed. Unfortunately, this color difference significantly leads to a reduction in the image quality of the display 0.

Therefore, to ensure that the self-powered display accomplishes not only the goals of energy conservation and carbon emission reduction but also offers improved display quality when integrated with transparent or opaque solar cells, it's imperative to develop an optimal technical solution to address the aforementioned problems.

SUMMARY OF THE INVENTION

The objective of the present invention is to provide a self-powered display device capable of enhancing the image quality of said device.

The present invention relates to a self-powered display device, which comprises a display module and a power module.

The display module of the present invention comprises a front side and a rear side. The front side is a display surface, while the power module is positioned on the rear side of the display module, and comprises multiple active and inactive surfaces distributed alternately. The visual color difference ($\Delta E$) between the inactive surfaces and the active surfaces is limited to a maximum of 10 color difference units. The visual color difference ($\Delta E$) is defined within the framework of the CIELAB color space, as established by the International Commission on Illumination (CIE) in 1976. The calculation formula for determining the visual color difference ($\Delta E$) is as follows: $\Delta E = [(\Delta L^*)^2 + (\Delta a^*)^2 + (\Delta b^*)^2]^{(1/2)}$, where L signifies color brightness, "a" represents the green-red value, and "b" represents the blue-yellow value. In this context, L spans in a range from 0 to 100, "a" is in a range between −128 and 127, and "b" is defined in a range within −128 to 127.

The display module is a cholesteric liquid crystal display module, while the power module is a solar cell module. Within this setup, the cholesteric liquid crystal display module enables the light beams enter to the solar cell module through its front side. Subsequently, the solar cell module receives the light beams, converting them into electricity and thus supplying the necessary energy for the cholesteric liquid crystal display module to exhibit a minimum of one image.

Furthermore, each active surface is a solar cell sheet, while each inactive surface features a busbar. The surface of the busbar can be provided with a shielding layer. The visual color difference between the shielding layer and the solar cell sheet as viewed from the direction towards the display module does not exceed a maximum of 10 color difference units, that is, when the shielding layer overlays the busbar, the visual color difference between the solar cell sheet and the busbar overlaid by the shielding layer remains within the range of 10 color difference units.

The shielding layer may include, but is not limited to, dark ink or adhesive tape.

The width of each of the inactive surfaces is less than or equal to 50 μm, and this range is narrower than the width recognizable by human eyes.

Furthermore, the present invention can also be a self-powered display device, which comprises a cholesteric liquid crystal display module, a solar cell module, and a shielding layer.

The cholesteric liquid crystal display module of the present invention has a front side and a rear side. The front side is a display surface, while the solar cell module is positioned on the rear side of the cholesteric liquid crystal display module and is electrically connected to it. The solar cell module comprises multiple solar cell sheets and several busbars positioned between these solar cell sheets. The shielding layer corresponds to and is disposed on the surface of each of the busbars. The visual color difference ($\Delta E$) between the shielding layer and the solar cell sheets is limited to within 10 color difference units.

The cholesteric liquid crystal display module enables light beams to enter the solar cell module from its front side. The solar cell module then converts the received light beams into electricity, which is used to provide electrical energy to the cholesteric liquid crystal display module so as to power the display to show at least one image.

The shielding layer may include, but is not limited to, dark-colored inks or adhesive tapes. For instance, the shielding layer could be opaque or composed of a low-transmittance dark material, such as black or dark blue tape.

The end surface of the solar cell module, which is away from the cholesteric liquid crystal display module, is provided with a light-absorbing layer. The light-absorbing layer serves to absorb any stray light that enters the solar cell module.

Furthermore, the present invention can also be a self-powered display device, which at least comprises a display module, a power module, and a shielding layer.

The display module comprises a front side and a rear side. The front side is a display surface, while the power module is positioned on the rear side of the display module and is electrically connected to the display module. The power module is provided with multiple active surfaces and multiple inactive surfaces located between these active surfaces. Each active surface is furnished with and corresponds to an electrode layer, while the shielding layer is situated on the inactive surface. The visual color difference ($\Delta E$) between the shielding layer and the active surface does not exceed 10 color difference units.

The display module is a cholesteric liquid crystal display module, and the power module is a solar cell module. The cholesteric liquid crystal display module permits light beams to enter the solar cell module from its front side. The solar cell module generates electricity upon receiving these light beams, thereby supplying the necessary energy for the cholesteric liquid crystal display module to display at least one image.

Each of the active surfaces is a solar cell, and each of the inactive surfaces is a busbar. The shielding layer covers the busbar, and visual color difference between the shielding layer and the solar cell as viewed from the direction towards the display module does not exceed 10 color difference units.

The shielding layer may include, but is not limited to, dark ink or adhesive tape.

A protective layer, positioned away from the shielding layer, is applied to cover the busbars. Additionally, it may come into contact with the solar cells.

The power module system may further comprise a transparent substrate positioned between the electrode layer and the display module.

Therefore, the present invention provides a self-powered display device primarily achieved by implementing a narrower inactive surface on the solar cell module beneath the cholesteric liquid crystal display module. The inactive surface, for instance, with a width of 50 μm or less imperceptible to the human eye or through the physical implementation of covering the inactive surface with a dark-colored shielding layer, can effectively minimize the visual color difference ($\Delta E$) between the inactive surface and the adjoining area. The visual chromatic aberration method ensures that a difference of the visual color difference ($\Delta E$) does not more than 10 color difference units. As a result, the method can significantly enhance and improve the viewing experience for users when observing images displayed by the cholesteric display module.

The foregoing features of the present invention may be combined with the following drawings in various combinations without exclusivity, unless expressly indicated otherwise. Apparently, descriptions of drawings in the following may be some of embodiments of the present invention, those of ordinary skill in the art may derive other drawings based on the following drawings without unduly experiments.

DETAILED DESCRIPTION OF THE PREFERRED EMBODIMENTS

The aforementioned constructions and associated functions and following detailed descriptions are exemplary for the purpose of further explaining the scope of the present invention. Other objectives and advantages related to the present invention will be illustrated in the subsequent descriptions and appended drawings. Furthermore, the present invention may be embodied in various modifications, and descriptions and illustrations are not-limiting.

The objective of the present invention is to introduce a self-powered display device. This self-powered display apparatus can incorporate solar cells in either a transparent or opaque manner. In addition to its capacity to generate power for image display, it also has the capability to minimize visual chromatic aberrations, thereby enhancing image quality.

Figure 3:
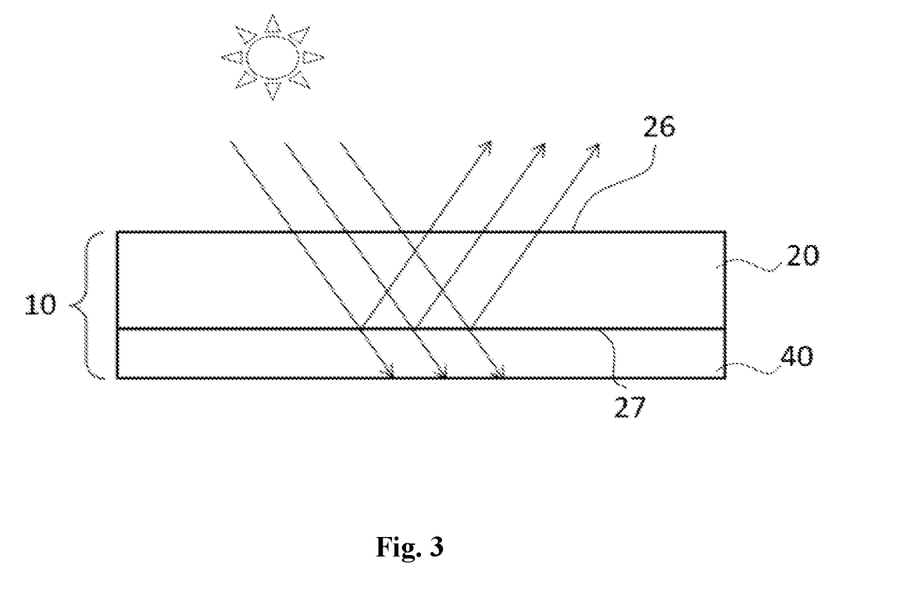
FIG. 3 is a cross-sectional view of the first embodiment of a self-powered display device of the present invention.
Figure 4:
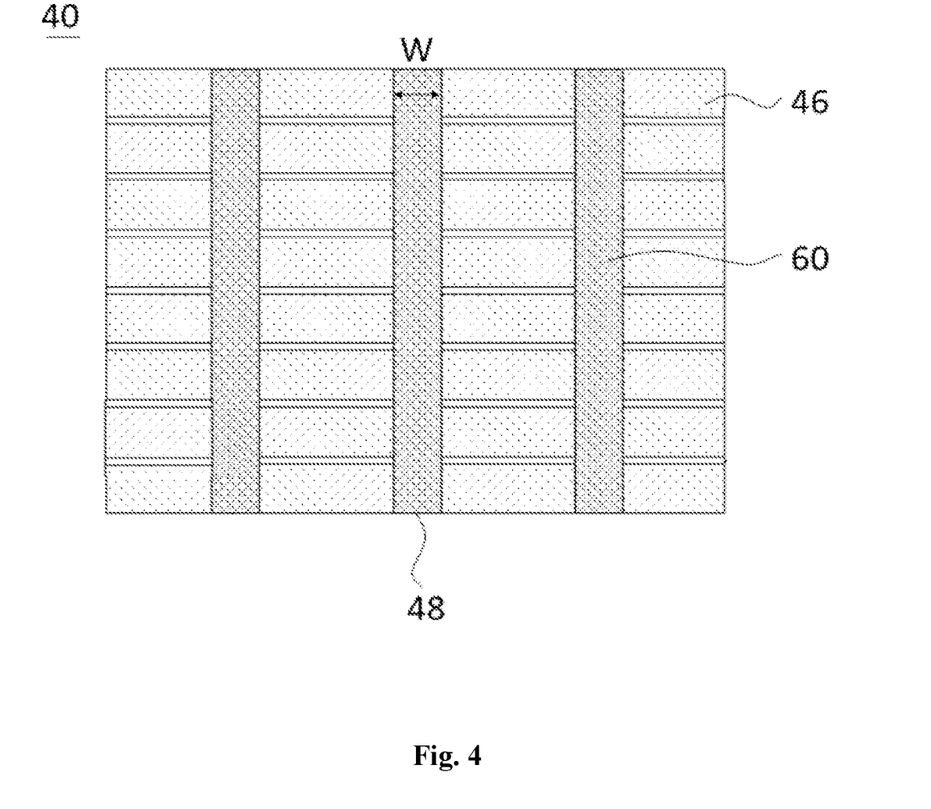
FIG. 4 is a top perspective view of the first embodiment of a solar cell of self-powered display device according to the present invention.

Please refer to FIG. 3 in conjunction with FIG. 4. FIG. 3 illustrates a cross-sectional view of the first embodiment of the self-powered display device of the present invention, while FIG. 4 is a top perspective view of a solar cell of the first embodiment for the self-powered display device according to the present invention. The present invention pertains to a self-powered display device 10, and comprises a display module and a power module. The display module takes the form of a cholesteric liquid crystal display module 20, while the power module adopts the configuration of a solar cell module 40. Furthermore, the solar cell module 40 is constructed using either an opaque monocrystalline silicon solar cell or a polycrystalline silicon solar cell.

The cholesteric liquid crystal display module 20 comprises a front side 26 and a rear side 27 positioned opposite to the front side 26. The front side 26 is a display surface to display at least one image. Additionally, the solar cell module 40 is implemented on the rear side 27 of the cholesteric liquid crystal display module 20, and electrically coupled to the cholesteric liquid crystal display module 20. The cholesteric liquid crystal display module 20 allows external light beams to enter into the solar cell module 40 from its front side 26. Subsequently, the solar cell module 40 converts these received light beams to generate electricity, thereby supplying the necessary energy for the cholesteric liquid crystal display module 20 to display the image.

The solar cell module 40 comprises multiple active surfaces and multiple inactive surfaces implemented among these active surfaces. The active surfaces, referred to as solar cell sheets 46 are light-receiving active surfaces. The inactive surfaces are also light-receiving inactive surfaces, and in the form of the busbars 48 positioned between the solar cell sheets 46. The solar cell sheets 46 is responsible for receiving external light beams (sunlight or ambient light sources), and converting them into electricity to power the cholesteric liquid crystal display module 20. The busbars 48 function as metal electrodes within the solar cell module 40 and facilitate external circuit connections. Thus, the visual color difference ($\Delta E$) between the inactive surfaces of the busbars 48 and the active surfaces of the solar cell sheets 46 does not exceed a limit of 10 color difference units.

Moreover, a shielding layer 60 can be applied to the surface of each of the busbars 48. The visual color difference ($\Delta E$) between the shielding layers 60 and the solar cell sheets 46, as viewed from the direction toward the cholesteric liquid crystal display module 20, does not exceed 10 color difference units. In other words, the shielding layer 60 is used to cover each of the busbars 48, ensuring that the visual color difference ($\Delta E$) between the solar cell sheets 46 and the busbars 48, now covered by the shielding layer 60, remains within 10 color difference units. Preferably, when the visual color difference ($\Delta E$) between the solar cell sheets 46 and the busbars 48 remains within 5 color difference units, more pixel enhancement can be achieved. Additionally, the shielding layer 60 is implemented using materials like dark ink or tape. In a preferred embodiment of the present invention, the shielding layer 60 comprises a dark-colored ink that is applied and overlaid onto the busbars 48.

In another embodiment of the present invention, the width W of each of the busbar 48 on the inactive surface may be equal to or less than 50 μm, and the range of the width W is falling within a range smaller than the perceptible width to the human eye. When it becomes challenging for the human eye to distinguish the separation between two adjacent solar cell sheets 46, denoted by the width W of the busbar 48, a noticeable visual color difference ($\Delta E$) is almost absent. The preferred range for the width W of the busbar 48 is in a range between 30 and 50 μm. Moreover, if the structure of the shielding layer 60 that covers the busbar 48 is implemented, a distinguishable visual color difference ($\Delta E$) would not be apparent.

Figure 5:
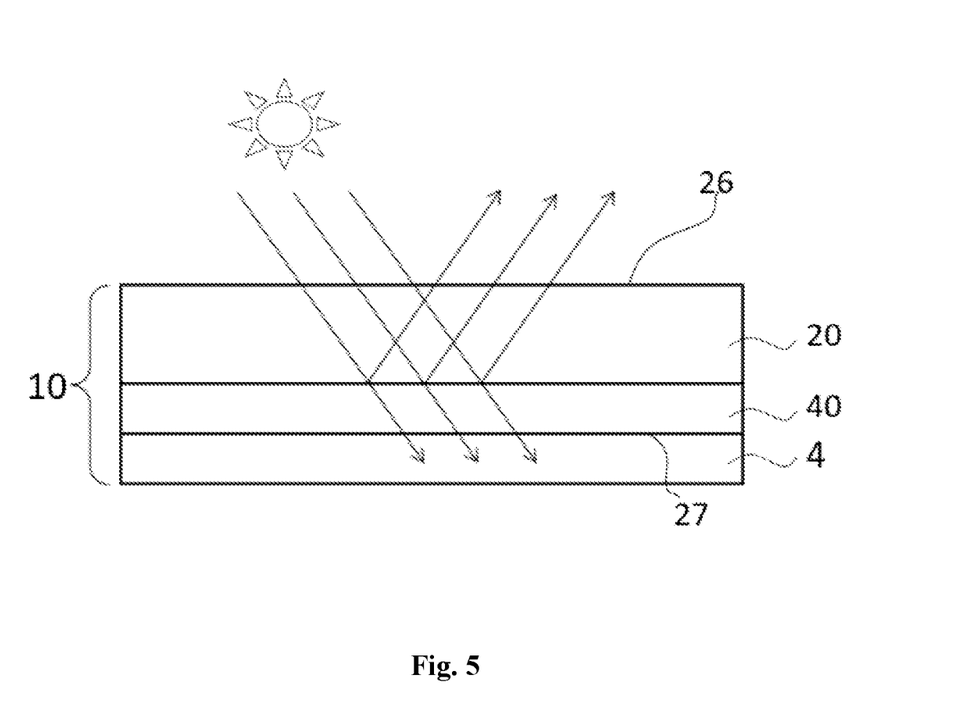
FIG. 5 is a cross-sectional view of the second embodiment of a self-powered display device of the present invention.
Figure 6:
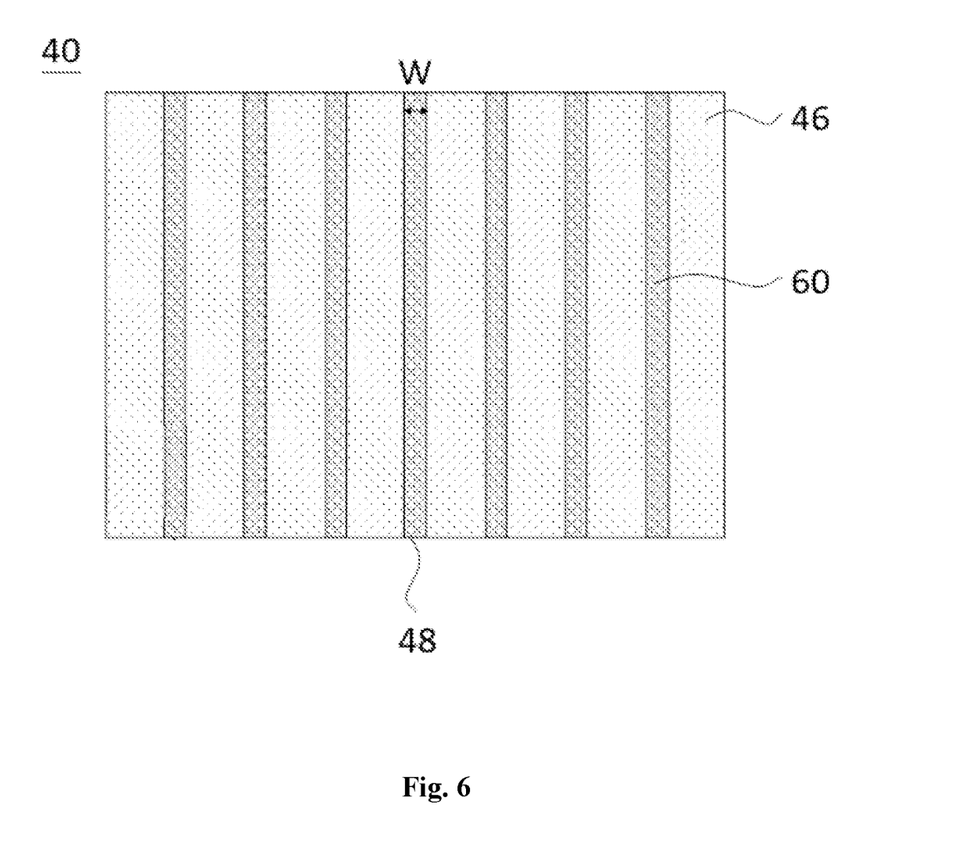
FIG. 6 is a top perspective view of the second embodiment of a solar cell of self-powered display device according to the present invention.

Please refer to FIG. 5 together with FIG. 6. FIG. 5 is a cross-sectional view of the second embodiment of a self-powered display device of the present invention, and FIG. 6 is a top view of the solar cell of the second embodiment of the self-powered display device of the present invention. The self-powered display device 10 of the present invention comprises a cholesteric liquid crystal display module 20, a solar cell module 40, a light-absorbing layer 4, and a shielding layer 60. The solar cell module 40 is manufactured using one of the following: a light-transmitting pattern organic solar cell, a dye-sensitized solar cell, or a perovskite solar cell, among others. That is, within the first and second embodiments of this present invention, the most prominent contrast in a self-powered display device 10 lies between these two embodiments: in the first embodiment, the solar cell module 40 consists of solar cells with an opaque pattern, while in the second embodiment, the solar cell module 40 is composed of solar cells featuring a light-transmitting pattern. As such, in the second preferred embodiment, the solar cell module 40 is supplemented with a light-absorbing layer 4 on the opposite surface of the cholesteric liquid crystal display module 20, serving to absorb any stray light that may penetrate through the solar cell module 40.

As depicted in the first embodiment, the shielding layer 60 overlays the busbars 48 of the solar cell module 40. The visual color difference ($\Delta E$) between this shielding layer 60 and the solar cell sheets 46, as viewed from the direction toward the cholesteric liquid crystal display module 20, is constrained to not surpass 10 color difference units. It implies that due to the presence of the shielding layer 60 on the busbars 48, the visual color difference ($\Delta E$) between the solar cell sheets 46 and the shielding layer 60 remains within 10 color difference units. Preferably, when the visual color difference ($\Delta E$) between the solar cell sheets 46 and the shielding layer 60 is restricted to 5 color difference units or less, it yields a more enhancement in pixel quality.

In another preferred embodiment, if the width (W) of each of the busbars 48 is less than or equal to 50 μm, it falls within a range that is smaller than the width distinguishable by the human eye. In other words, it becomes challenging for the human eye to discern the precise width of the busbars 48, leading to an almost imperceptible visual color difference ($\Delta E$). The preferred width (W) of the busbars 48 lies in a range of 30 to 50 μm. When the shielding layer 60 is used to cover the busbars 48, it's even more challenging for human eyes to visually identify any visual color difference ($\Delta E$) between the shielding layer 60 and the solar cell sheets 46.

Figure 7:
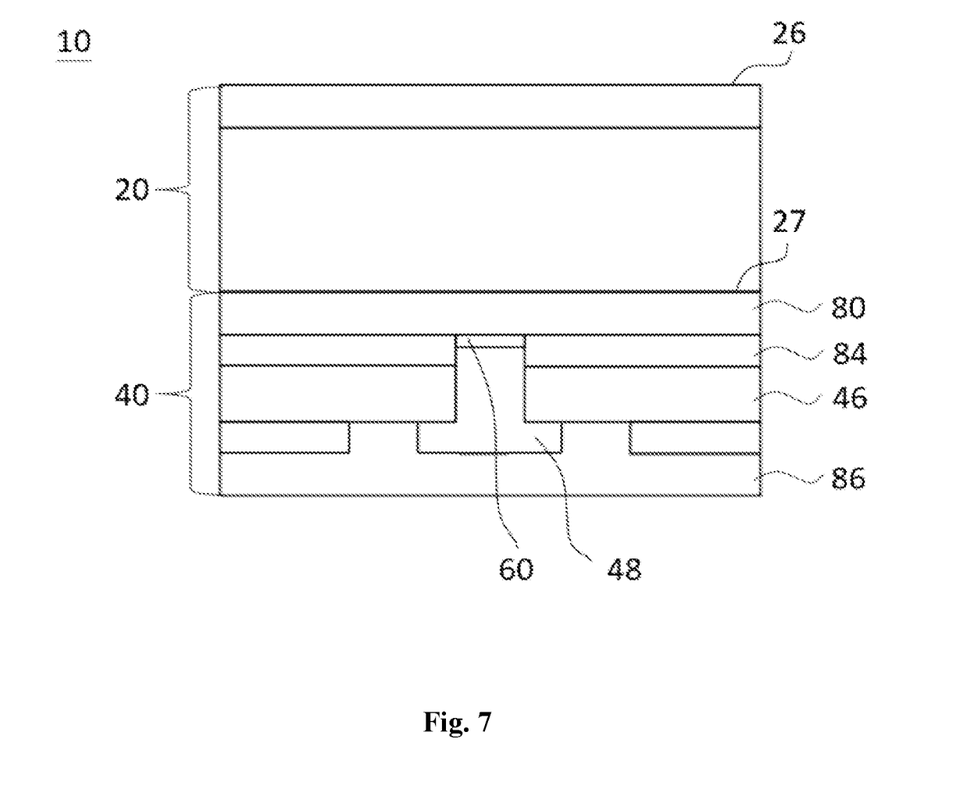
FIG. 7 is a cross-sectional view of the third embodiment of a self-powered display device of the present invention.

Please refer to FIG. 7, illustrating a cross-sectional view of the third embodiment of a self-powered display device according to the present invention. The self-powered display device 10 comprises at least a cholesteric liquid crystal display module 20, a solar cell module 40, and a shielding layer 60. In this embodiment, the cholesteric liquid crystal display module 20 is designed to allow external light beams to penetrate from its front side 26. These light beams subsequently enter the solar cell module 40. As a result of this interaction, the solar cell module 40 is capable of converting the received light beams into electricity. This generated electric energy is then supplied to the cholesteric liquid crystal display module 20 to effectively display images.

The cholesteric liquid crystal display module 20 comprises a front side 26 and a rear side 27 situated opposite to the front side 26. The front side 26 is a display surface, intended for displaying at least one image.

Moreover, the solar cell module 40 is implemented onto the rear side 27 of the cholesteric liquid crystal display module 20, and establishes an electrical connection with the cholesteric liquid crystal display module 20. The solar cell module 40 comprises at least a plurality of active surfaces, a plurality of inactive surfaces situated between these active surfaces, a transparent substrate 80, an electrode layer 84, and a protective layer 86. Each of the active surface is a solar cell sheet 46, while each of the inactive surfaces corresponds to the busbar 48, which is implemented between the solar cell sheets 46 and is constructed using a metallic element. The transparent substrate 80 is implemented in a transparent manner and is positioned between the solar cell sheet 46 and the cholesteric liquid crystal display module 20. That is, it signifies that the transparent substrate 80 concurrently covers both the solar cell sheet 46 and the busbars 48. Besides, the electrode layer 84 is implemented in a transparent manner and corresponds to the solar cell sheet 46 and is in contact with the transparent substrate 80. Due to the intermittent arrangement of the solar cell sheets 46, and the busbars 48 are arranged between the solar cell sheets 46, the electrode layer 84 also exhibits a discontinuous pattern. Both the transparent substrate 80 and the electrode layer 84 are transparent and can allow the external light beams from the front side 26 of the cholesteric liquid crystal display module 20 to penetrate to the solar cell sheet 46. In addition, the protective layer 86 is employed to envelop the busbar 48, starting away from one end of the cholesteric liquid crystal display module 20 so as to protect the solar cell module 40. Due to the intermittent nature of the busbars 48, the protective layer 86 fills the gaps existing between the busbars 48 and comes into contact with the solar cell sheets 46. As a result, the protective layer 86 becomes securely positioned on the shielding layer 60 of the busbars 48 so that the overall stability of the solar cell module 40 is enhanced.

In addition, the shielding layer 60 is disposed between the busbar 48 and the transparent substrate 80. That is, the visual color difference ($\Delta E$) between the shielding layer 60 and the solar cell sheet 46 as viewed from the direction toward the cholesteric liquid crystal display module 20 is not more than 10 color difference units. Preferably, when the visual color difference ($\Delta E$) between the above two is within 5 color difference units, more enhancement in pixel quality can be achieved.

In another preferred embodiment of the present invention, if the width of the busbar 48 is equal to or less than 50 μm, then it is not necessary to dispose the shielding layer 60 on the busbar 48. This is due to the difficulty in visually discerning busbar's widths narrower than 50 μm. As a result, the technical requirement that the visual color difference ($\Delta E$) between the shielding layer 60 and the solar cell sheet 46, as observed from the direction toward the cholesteric liquid crystal display module 20, remains within 10 color difference units, will still be achieved. Of course, it should be noted that if the shielding layer 60 is implemented onto the narrower busbar 48 simultaneously, the advantage of reducing the overall color difference can still be realized.

Therefore, the present invention provides a self-powered display device 10. The shielding layer 60 can be positioned either externally or internally, ensuring that the visual color difference ($\Delta E$) between the region covered by the shielding layer 60 and the surrounding area, when observed from the direction towards the cholesteric liquid crystal display module 20, remains within 10 color difference units, and potentially even below 5 color difference units. As a result, the pixel quality of the self-powered display device 10 is significantly enhanced.

The descriptions illustrated above set forth simply the preferred embodiments of the present invention; however, the characteristics of the present invention are by no means restricted thereto. All changes, alterations, or modifications conveniently considered by those skilled in the art are deemed to be encompassed within the scope of the present invention set forth by the following claims.

What is claimed is:

1. A self-powered display device, comprising:
   a display module, comprising a front side and a rear side, wherein the front side is a display surface; and
   a power module, positioned on the rear side of the display module and electrically connected to the display module, and comprising multiple active and inactive surfaces distributed alternately;
   wherein a visual color difference ($\Delta E$) between the inactive surfaces and the active surfaces is within a maximum of 10 color difference units, and the visual color difference ($\Delta E$) is defined within the framework of the CIELAB color space, as established by the International Commission on Illumination (CIE) in 1976;
   wherein the display module is a cholesteric liquid crystal display module, while the power module is a solar cell module, and the cholesteric liquid crystal display module enables the transmission of light beams to the solar cell module through its front side, the solar cell module subsequently receives the light beams and convert the light beams into electricity to supply necessary energy for the cholesteric liquid crystal display module to exhibit a minimum of one image; and
   wherein each of the active surfaces is a solar cell sheet, each of the inactive surfaces is a busbar, the busbars function as metal electrodes within the solar cell module and facilitate external circuit connections, and a shielding layer is provided on surfaces of the busbars, and the visual color difference ($\Delta E$) between the inactive surfaces of the busbars and the active surfaces of the solar cell sheets as observed from a direction towards the display module does not exceed a limit of 10 color difference units.

2. The self-powered display device according to claim 1, wherein the shielding layer is made of dark ink or adhesive tape.

3. The self-powered display device according to claim 1, wherein width of each of the inactive surfaces is less than or equal to 50 μm.

* * * * *